(12) United States Patent
Tanaka et al.

(10) Patent No.: US 6,733,593 B1
(45) Date of Patent: May 11, 2004

(54) FILM FORMING DEVICE

(75) Inventors: Sumi Tanaka, Kofu (JP); Masatake Yoneda, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/646,343

(22) PCT Filed: Jan. 17, 2000

(86) PCT No.: PCT/JP00/00173

§ 371 (c)(1),
(2), (4) Date: Sep. 18, 2000

(87) PCT Pub. No.: WO00/42235

PCT Pub. Date: Jul. 20, 2000

(30) Foreign Application Priority Data

Jan. 18, 1999 (JP) ............................. 11/009529

(51) Int. Cl.[7] ............................ C23C 16/00; C23F 1/00; H01L 21/306
(52) U.S. Cl. .................. 118/725; 118/724; 156/345.52; 156/345.51; 156/345.37
(58) Field of Search ....................... 156/345.51, 345.52, 156/345.37; 118/715, 724, 725; 219/444.1

(56) References Cited

U.S. PATENT DOCUMENTS

| 5,055,264 A | * | 10/1991 | Czarnecki ..................... 422/80 |
| 5,254,171 A | * | 10/1993 | Hayakawa et al. .. 118/723 MR |
| 5,267,607 A | * | 12/1993 | Wada ....................... 165/180.1 |
| 5,294,778 A | * | 3/1994 | Carman et al. ............. 219/385 |
| 5,304,248 A | * | 4/1994 | Cheng et al. ................ 118/728 |
| 5,383,971 A | * | 1/1995 | Selbrede ...................... 118/728 |
| 5,437,757 A | * | 8/1995 | Rice et al. ................... 156/345 |
| 5,505,779 A | * | 4/1996 | Mizuno et al. .............. 118/719 |
| 5,551,982 A | * | 9/1996 | Anderson et al. ........... 118/715 |
| 5,574,247 A | * | 11/1996 | Nishitani et al. ........... 118/708 |
| 5,595,241 A | * | 1/1997 | Jelinek ....................... 165/80.1 |
| 5,635,244 A | * | 6/1997 | Mayeda et al. .......... 427/248.1 |
| 5,705,223 A | * | 1/1998 | Bunkofske ................... 427/240 |
| 5,711,815 A | * | 1/1998 | Lee et al. .................... 118/725 |
| 5,882,419 A | * | 3/1999 | Sinha et al. ................. 118/729 |
| 5,997,651 A | * | 12/1999 | Matsuse et al. ............. 118/725 |

* cited by examiner

Primary Examiner—P. Hassanzadeh
Assistant Examiner—Karla Moore
(74) Attorney, Agent, or Firm—Oblon, Spivak, McClelland, Maier & Neustadt, P.C.

(57) ABSTRACT

A film deposition apparatus of the present invention includes a container forming a processing chamber for processing a target object, a mounting table which is provided in the processing chamber and on which the target object is mounted, a first heating apparatus provided in the mounting table, for heating the target object mounted on the mounting table, a first gas supply section provided in the container, for supplying processing gas into the processing chamber, the processing gas forming a high-melting-point metal-film layer on the target object mounted on the mounting table, a movable clamp for clamping a periphery of the target object and holding the target object on the mounting table, a second heating apparatus formed separately from the clamp, for heating the clamp indirectly, a gas flow path formed between the clamp and the second heating apparatus when the clamp is moved to a position where the clamp clamps the target object, and a second gas supply section for causing backside gas to flow into the gas flow path.

20 Claims, 4 Drawing Sheets

FILM FORMING DEVICE

BACKGROUND OF THE INVENTION

1. Field of the Invention

The present invention relates to a film deposition apparatus.

2. Discussion of the Background

In a semiconductor device having a MOS (Metal Oxide Semiconductor) field-effect transistor structure, for example, an aluminum alloy of Al, Si and Cu is employed as a constituting material for a wiring layer. When a wiring layer containing aluminum is deposited on a silicon substrate constituting a semiconductor wafer (simply referred to as "wafer" hereinafter) by heat treatment, it is likely that aluminum of the wiring layer and silicon of the substrate will be inter-diffused to destroy a diffusion layer. The addition of silicon to the aluminum alloy thus prevents the above inter-diffusion from occurring. However, there occurs a problem that contact resistance is increased because silicon is precipitated out of the aluminum alloy onto the silicon substrate in a contact portion to form an n-type silicon layer and a p-type silicon layer, which causes a so-called pn junction, in accordance with miniaturization of the semiconductor device. A barrier metal layer is therefore interposed between the silicon substrate and the wiring layer in order to prevent silicon of the substrate and aluminum of the wiring layer from reacting on each other and prevent a pn junction from occurring.

A titanium alloy, such as TiN and Ti-W, or titanium, whose reactivity is lower than that of a conventionally-used tungsten alloy or tungsten and whose property is very stable toward heat or the like, has recently been adopted as a constituting material for the barrier metal layer.

Furthermore, instead of a sputtering system, a CVD (Chemical Vapor Deposition) system has recently been used as a film deposition apparatus for forming a barrier metal layer in order to improve a film coverage state in a step portion of a silicon substrate or a step coverage. For example, a thermal CVD system is used to form a barrier metal layer from TiN.

However, the dependence of deposition speed on temperature in processing (deposition) gas for depositing a TiN layer is higher than that in processing gas for depositing a conventional tungsten alloy film layer. If, therefore, the periphery of a wafer mounted on a mounting table is held by a clamp as in the thermal CVD system for depositing a tungsten alloy film, the clamp absorbs heat from the periphery of the wafer, and the distribution of temperatures of the substrate becomes nonuniform, with the result that a uniform barrier metal layer is difficult to form. In the thermal CVD system for depositing a TiN film, as shown in FIG. 6A, a wafer W is simply mounted on a mounting table 10, without using any clamp, to subject it to deposition processing.

However, in the thermal CVD system described above, the wafer W is simply mounted on the mounting table 10; therefore, as shown in FIG. 6A, a TiN-film layer 12 will be formed on the periphery of the wafer W as well as on the top thereof. After the barrier metal layer is deposited, generally, a metal film (wiring layer) 11 is formed on the barrier metal layer 12 and the metal film 11 is flattened. This flattening needs to be performed by CMP (Chemical Mechanical Polishing) since the metal film 11 has to improve in degree of flatness in accordance with hyperfine structure and extremely-multilayer structure of a semiconductor device. If, however, the metal film 11 on the top of the wafer. W is flattened by CMP, the TiN-film layer 12 is not removed but remains on the periphery of the wafer W, as shown in FIG. 6B. In other words, there is a film which cannot be removed but remains on the periphery of the wafer W after the metal film 11 deposited on the barrier metal layer 12 is flattened. Consequently, the remaining peripheral film comes off in a processing chamber for post-processing and causes a contamination, thereby reducing yields.

If, moreover, the metal film 11 is flattened by, e.g., plasma etching, the TiN-film layer 12 is removed from the periphery of the wafer W simultaneously with the flattening. However, there is a limit to accurate control of plasma and thus it is difficult to increase a degree of flatness of the metal film.

SUMMARY OF THE INVENTION

The object of the present invention is to provide a film deposition apparatus capable of uniformly maintaining the distribution of temperatures of the entire surface of a target object to be processed, without exposing the periphery of the target object to processing gas.

The above object is attained by a deposition apparatus described below. A film deposition apparatus of the present invention includes a container forming a processing chamber for processing a target object; a mounting table which is provided in the processing chamber and on which the target object is mounted; a first heating apparatus provided in the mounting table, for heating the target object mounted on the mounting table; a first gas supply section provided in the container, for supplying processing gas into the processing chamber, the processing gas forming a high-melting-point metal-film layer on the target object mounted on the mounting table; a movable clamp for clamping a periphery of the target object and holding the target object on the mounting table; a second heating apparatus formed separately from the clamp, for heating the clamp indirectly; a gas flow path formed between the clamp and the second heating apparatus when the clamp is moved to a position where the clamp clamps the target object; and a second gas supply section for causing backside gas to flow into the gas flow path.

According to the above structure, when a target object is clamped, the clamp is brought into intimate contact with the periphery of the target object to block a space between the processing surface (top surface) of the object and the side thereof, and the backside gas prevents processing gas from flowing around the periphery of the object, so that it is difficult for the processing gas, which is supplied to the processing surface of the object, to reach the side of the object. Consequently, a high-melting-point metal-film layer becomes difficult to form on the periphery of the target object and thus the occurrence of particles due to exfoliation of the high-melting-point metal film can be minimized. Since, moreover, the clamp is heated by means of radiant heat from a heating source and backside gas, the temperature of the periphery of the target object is not lowered when the object is clamped and thus a uniform film can be deposited on the entire surface of the object.

If the gas flow path extends so as to pass the edge portion of the target object clamped by the clamp and the periphery of the mounting table, the processing gas does not reach the periphery of the target object, so that a high-melting-point film-layer can be prevented from being formed on the side of the object. Furthermore, in order to prevent the processing gas from flowing around the object, it is preferable to form the gas flow path such that the backside gas is exhausted in the direction of the outer circumference of the clamp.

In order to reliably prevent a high-melting-point metal-layer from being deposited on the side of the target object, it is preferable to adopt inert gas as the backside gas. Further, in order to minimize an influence of the backside gas emitted into the processing chamber upon the deposition processing, it is preferable to adopt the same gas as part of gas components constituting the processing gas, as the backside gas. When the gas flow path is shortened due to the restriction by the structure of the mounting table and tubing for supplying backside gas, and a predetermined conductance cannot be secured in the gas flow path, it is preferable to provide the gas flow path with a buffer section for controlling the conductance of the gas flow path.

If the clamp is shaped like a ring and clamps all of the edge portion of the target object against its inner side, entire peripheries of the object can reliably be clamped, and the periphery of the object can be maintained airtightly from the atmosphere of the processing chamber can be delimited airtightly. If, moreover, a tapered surface, which is brought into line contact with the object, is formed on the inner side of the clamp against which the object is clamped, the airtightness of the gas flow path is increased when the object is clamped against the tapered surface, and a high-melting-point metal-film can be prevented more reliably from being deposited to the periphery of the object. If the object is clamped against the tapered surface, given airtightness can be secured even when the object is placed inaccurately on the mounting table.

If the present invention is applied to the case where the uniform temperature distribution of the object to be processed is particularly required as in the case where a high-melting-point metal-film made of Ti or a Ti alloy is deposited, better results can be produced.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

A preferred embodiment in which a film deposition apparatus according to the present invention is applied to a thermal CVD system (simply referred to as "CVD system" hereinafter), will now be described with reference to the accompanying drawings.

(1) Structure of Processing Apparatus

Figure 1:
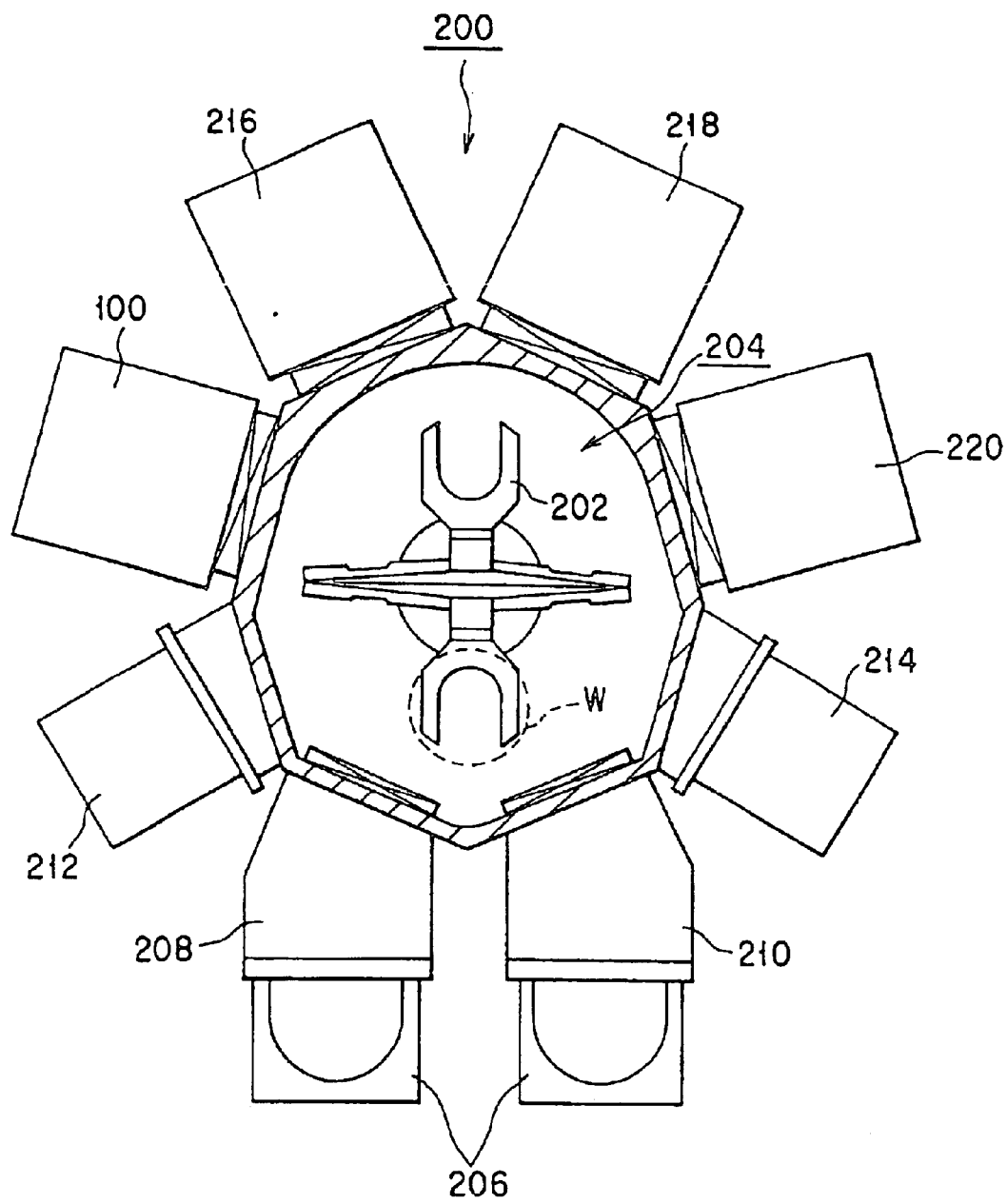
FIG. 1 is a schematic plan view of a processing apparatus having a thermal CVD system to which the present invention is applied.

Referring to FIG. 1, the structure of a multi-chamber type processing apparatus 200 in a cluster to which a CVD system 100 of the present embodiment is connected, will be described first.

As shown, the processing apparatus 200 is so constituted that a plurality of chambers are arranged radially around a common transfer chamber 204 including a carrier arm 202. More specifically, the processing chamber 200 is constituted of cassette chambers 208 and 210 for delivering wafers W between the common transfer chamber 204 and cassettes 206, vacuum chambers 212 and 214 for preheating the wafers W or cooling them after deposition, and CVD systems 100, 216, 218 and 220 having substantially the same structure and designed for film deposition on the wafer W.

with the above constitution, the wafers W in the cassettes 206 are carried into the vacuum chamber 212 by means of the carrier arm 202 through the cassette chambers 208 and 210 and the common transfer chamber 204 and then preheated. The preheated wafers W are transferred to the CVD systems 100, 216, 218 and 220, and a barrier metal layer (high-melting-point metal-film layer) made of TiN and Ti is deposited on each of the wafers W. The wafers W, which are subjected to the predetermined deposition, are transferred into the vacuum chamber 214 and cooled, and the cooled wafers W are stored again in the cassettes 206 through the common transfer chamber 204 and cassette chambers 208 and 210.

(2) Configuration of CVD System

The configuration of the CVD system 100 of the present embodiment will now be described with reference to FIGS. 2 to 4.

(A) Overall Configuration of CVD System

The overall configuration of the CVD system 100 will be described first with reference to FIG. 2. A processing chamber 102 of the CVD system 100 is formed in an airtight processing container 104. A heater 106 is provided on the side wall of the processing chamber 102 to heat the inner wall of the processing chamber 102 to a predetermined temperature. Another heater 108 is mounted on the top of the processing chamber 104 to heat a gas supply section 118, which will be described later, to a predetermined temperature. The processing chamber 102 includes a mounting section 112 supported by columns 110, and a mounting table 114 (see FIG. 3), which will be described later, is provided in the mounting section 112 on which a wafer W is mounted. The structure of the mounting section 112 will be detailed later.

The gas supply section 118 is provided on the ceiling section of the processing chamber 102. The gas supply section 118 is a so-called showerhead type gas supply device, and allows processing gas, which is supplied from a gas supply source 128 via both an open/close valve and a flow-rate control valve 122, to be diffused in a gas diffusing chamber 120 and then uniformly supplied into the processing chamber 102 from a number of gas jet holes 118 formed on the face opposed to the mounting table 114.

Furthermore, a vacuum pump 130 for evacuating the processing chamber 102 is connected to the lower portion of the processing chamber 102 through an evacuation path 132. Since, in the above structure, the processing gas supplied into the processing chamber 102 is sprayed on the processing surface of the wafer W held on the mounting table 114 and then exhausted through the periphery of the mounting table 114, it can be supplied uniformly to the entire processing surface of the wafer W, with the result that uniform deposition processing can be performed.

(B) Structure of the Mounting Section

Figure 3:
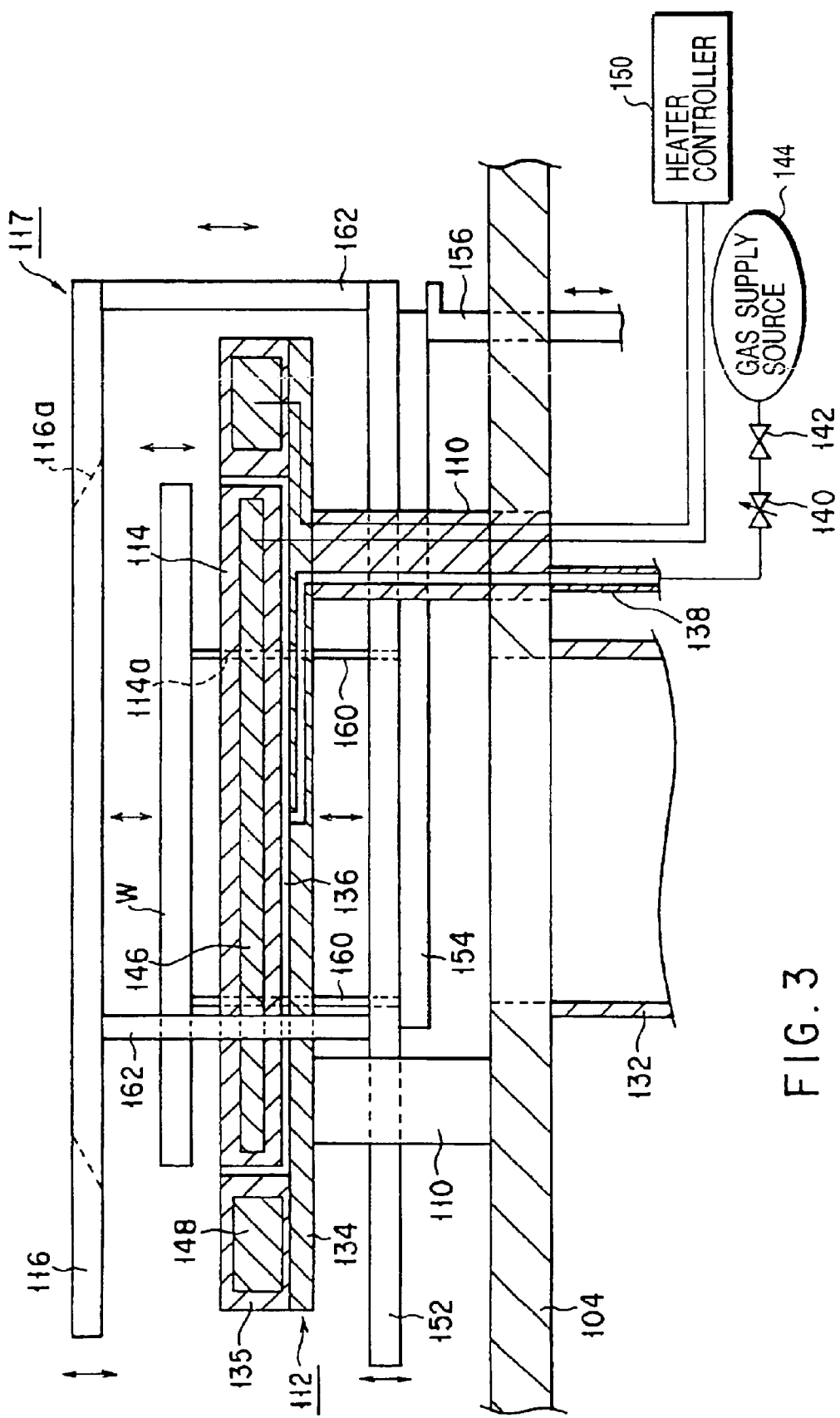
FIG. 3 is a schematic cross-sectional view of a mounting table of the thermal CVD system shown in FIG. 2.

Referring to FIG. 3, the structure of the mounting section 112 will now be described in detail. The mounting section 112 is constituted of an almost disk-shaped mounting table 114 capable of mounting a wafer W and an almost ring-shaped heating block 135 arranged so as to surround the mounting table 114. The mounting table 114 includes a heating apparatus 146 capable of heating the wafer W under control of a heater controller 150 during the processing. As will be described later, the heating block 135 is used to heat a clamp section 116 during the processing and includes another heating apparatus 148 which is controlled by the foregoing heater controller 150. It is preferable that the heating apparatuses 146 and 148, which are included in the mounting table 114 and heating block 135, be zone heaters capable of heating for each divided region. The use of the zone heaters allows the temperature controllability to be improved.

The mounting table 114 and heating block 135 are mounted on the top of a supporting plate 134 supported by a plurality of quartz-made columns (quartz tubes) 110, e.g., three or four columns. Each of the columns 110 includes wiring of an electric wiring system for supplying power and control signals to the above heating apparatuses 146 and 148 or tubing of a gas supply system for supplying backside gas to the mounting table 114 and the periphery of the wafer W as film-depositing prevention gas.

Pin holes 114a, the number of which corresponds to that of lifter pins 160, are formed in the above mounting table 114 such that the lifter pins 160 can be passed through therein. The plural lifter pins 160, in e.g., three lifter pins 160 are attached to the top of a lifting/lowering arm 154 so as to move up and down through the pin holes 114a. The arm 154 is supported by a lifting/lowering shaft 156 which is lifted and lowered by an actuator not shown. In other words, the lifter pins 160 protrude from the surface of the mounting table 114 and operates so as to receive or deliver the wafer W when the wafer W is carried in and out, and they lower below the surface of the mounting table 114 and mount the wafer W on the surface of the mounting table 114 when the wafer W is processed.

The processing chamber 102 also includes a clamp mechanism 117 for clamping the wafer W on the mounting table 114 during the processing. The clamp mechanism 117 is made of ceramics and metal, such as AlN, and includes an almost ring-shaped clamp section 116 arranged around the mounting table 114, a plurality of columns (lifter pins) 162, e.g., three or four columns to support the clamp section 116, a lifter pin holder 152 for supporting the columns 162, and a lifting/lowering mechanism (not shown) for lifting and lowering the lifter pin holder 152. In the present embodiment, the lifter pin holder 152 for supporting the clamp section 116 and the arm 154 for supporting the lifter pins 160 are formed integrally as one component and lifted and lowered integrally through the lifting/lowering shaft 156 by the actuator not shown. It is however needless to say that the lifter pin holder 152 and the arm 154 can be lifted and lowered by different lifting/lowering mechanisms.

When the clamp section 116 and the lifter pins 160 are operated integrally as one component, the clamp section 116 has to be provided above the tips of the lifter pins 160. In the lowering operation, the wafer W supported by the lifter pins 160 can be clamped by the clamp section 116 after it is mounted on the mounting table 114 by the lowering operation of the lifter pins 160. In the lifting operation, the wafer W can be lifted up by the lifter pins 160 after the clamping is released by the clamp section 116. When the wafer W is delivered to the lifter pins 160 by a carrier arm, not shown, or when the wafer is received from the lifter pins 160 to a carrier arm, the clamp section 116 is located above the carry-in/carry-out path and therefore it does not disturb the carrying-/carry-out operation.

The structure of the clamp section 116 will now be described in detail. As has been described, the clamp section 116 is shaped almost like a ring and, as shown in FIG. 4, it has an inside diameter enough to clamp the wafer W. More specifically, the clamp section 116 has a tapered surface 116a on the inner edge thereof, and the tapered surface is formed upward such that it can be brought into contact with the outer edge of the a wafer W. Since the tapered surface 116a is formed on the inner edge of the clamp section 116, it can be brought into line-contact with the periphery of the wafer W. It is thus possible to increase tolerances of the position of the wafer W mounted on the mounting table 114, prevent processing gas from diffusing around the edge portion of the wafer W, and increase airtightness of a backside-gas flow path which will be described later.

Figure 4:
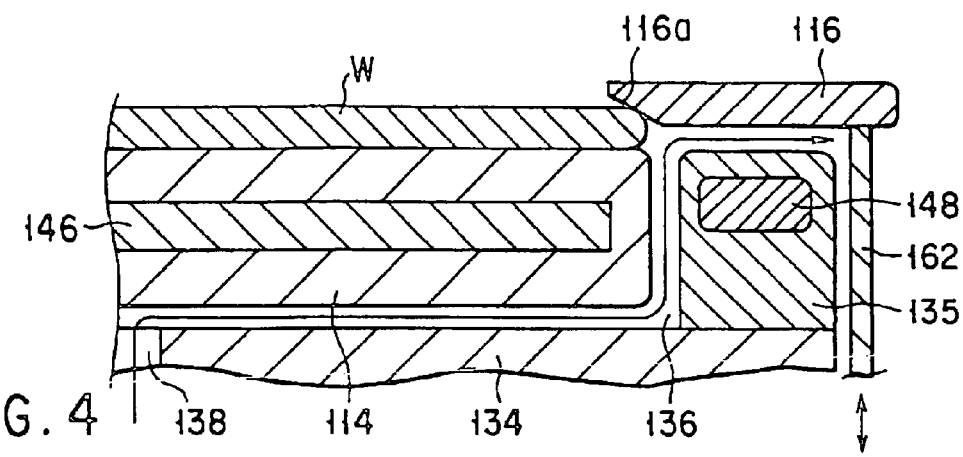
FIG. 4 is a schematic cross-sectional view of the mounting table of the thermal CVD system shown in FIG. 2 when a wafer is pressed.

Referring to FIGS. 3 and 4, the backside-gas flow path will now be described in detail. In the present embodiment, as has been described in FIG. 4, the periphery of the wafer W has to be separated airtightly from the internal environment of the processing chamber 102 by the tapered surface 116a of the clamp section 116 so as to prevent the processing gas from flowing around the edge portion of the wafer W when the wafer W mounted on the mounting table 114 is clamped by the clamp section 116. Moreover, the clamp section 116 has to be heated indirectly by the heating block 135 so as to prevent the temperature of the processing surface of the wafer W from being influenced in contact with the clamp section 116. The clamp section 116 can be heated by only the radiant heat from the heating block 135. If backside gas is caused to flow between the clamp section 116 and the heating block 135, heat can be transmitted to the clamp section 116 effectively and efficiently.

As illustrated in FIG. 3, the backside-gas flow path is secured as follows. The backside gas, which is guided from a gas supply source 144 to a gas flow path 136 formed between the supporting plate 134 and the mounting table 114 through an opening/closing valve 142, a flow-rate control valve 140, and a tube 138 penetrating the columns 110, flows around the mounting table 114 and is then guided to the periphery of the wafer W. The gas goes out of the outer circumference of the clamp section 116 through a space formed between the heating block 135 and the clamp section 116.

According to the present embodiment, the following advantages can be obtained if the backside-gas flow path is secured.

(a) By supplying the backside gas to the periphery of the wafer W from that of the mounting table 114, the processing gas can be prevented from flowing around the edge portion of the wafer W and thus a film can be prevented from being deposited on the periphery of the wafer W. According to the present embodiment, the tapered surface 116a of the clamp section 116 and the periphery of the wafer W are brought into line-contact with each other and the clamp section 116 is pressed down by given force, so that airtightness is secured to some extent. If, however, the backside gas is supplied to the periphery of the wafer W as described above, the processing gas can be prevented from flowing around the edge portion of the wafer W even though complete airtightness is not obtained in a contact portion between the tapered surface 116a of the clamp section 116 and the periphery of the wafer W.

(b) Since the backside gas is caused to flow in a space formed between the heating block 135 and the clamp section 116, it acts as a heat-transfer medium to quickly transfer heat from the heating block 135 to the clamp section 116. It is thus possible to quickly heat the clamp section 116 to a desired temperature.

Various types of gas can be adopted as the backside gas in accordance with the type of processing. However, it is preferable to adopt gas which is effective in heat-transfer characteristic and does not have an adverse effect upon the processing in the processing chamber 102. For example, inert gas such as $N_2$ and Ar can be adopted.

(3) Film Deposition Process

Figure 2:
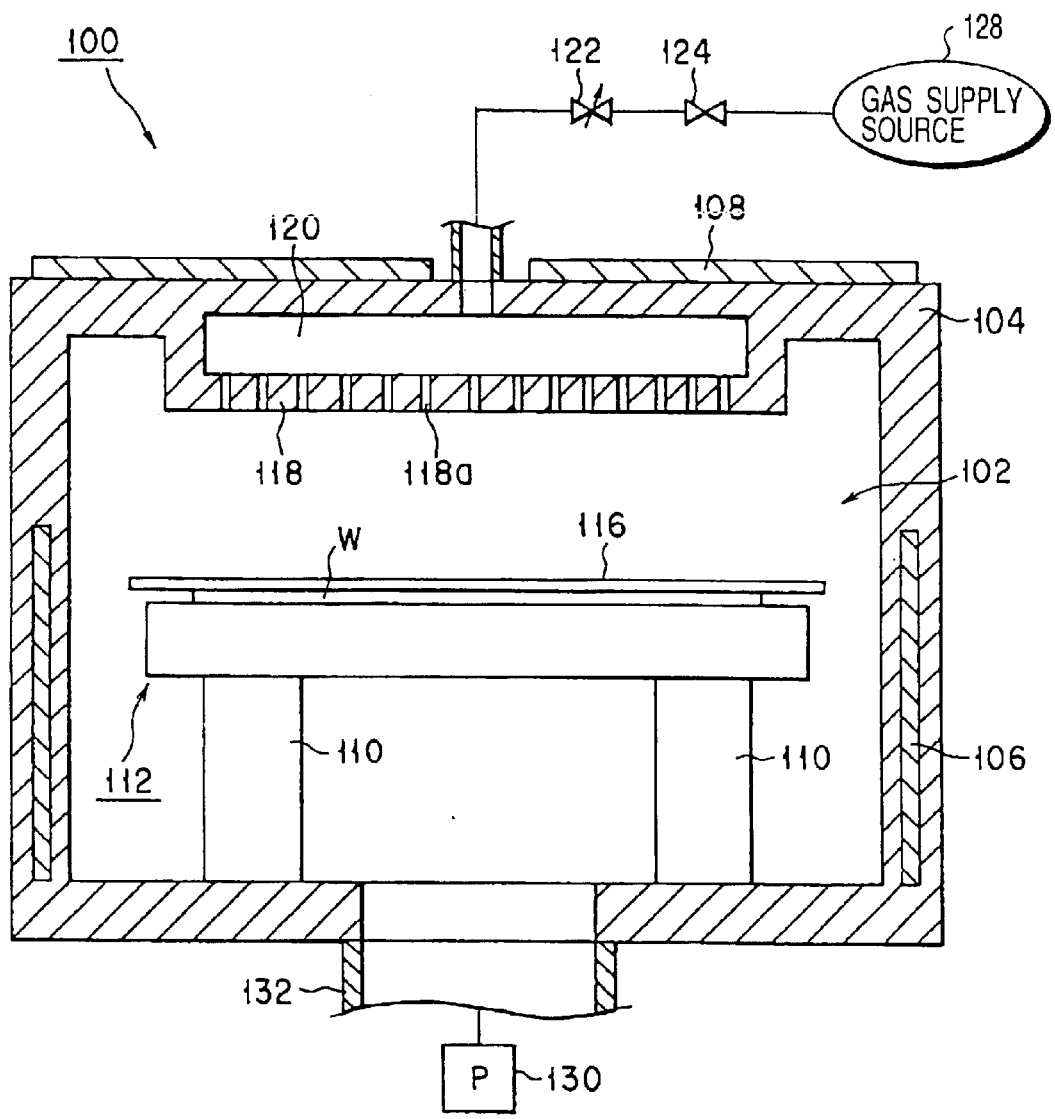
FIG. 2 is a schematic cross-sectional view of the thermal CVD system shown in FIG. 1.

Referring to FIGS. 2 to 4, a film deposition process in the CVD system 100 will now be described. First the lifter pin holder 152 shown in FIG. 3 is lifted and a wafer W of a silicon substrate is placed on the lifter pin 160. Then the lifter pin holder 152 is lowered, and the wafer W is mounted on the mounting table 114 and, at the same time, the periphery of the wafer W is pressed by the clamp section 116. Further, the opening/closing valve 142 is opened and the opening of the flow-rate control valve 140 is controlled to supply inert gas from the gas supply source 144 into the gas flow path 136. As indicated by the arrow in FIG. 4, the inert gas passes the periphery of the wafer W and is emitted toward the outer circumference of the clamp section 116 through between the clamp section 116 and the heating block 135. The flow rate and pressure of the inert gas supplied into the gas flow path 136 are set so as to prevent the processing gas, which is to be supplied into the processing chamber 102, from entering the gas flow path 136 or the like and so as not to disturb the flow of the processing gas in the processing chamber 102 when the inert gas is emitted.

The wafer W is heated to, e.g., 400° C. to 800° C., preferably about 700° C. by the heating apparatus 146 included in the mounting table 114, whereas the clamp section 116 is heated by the heating apparatus 148 included in the heating block 135, Since, in the present embodiment, the clamp section 116 does not directly contact the heating block 135, it is heated indirectly through the inert gas flowing through the gas flow path 136 formed between the clamp section 116 and the heating block 135.

The temperature control of the clamp section 116 will now be described. The temperature of the wafer W is sensed by a temperature sensor, not shown, which is provided in the heating apparatus 146, and the temperature information is input to the heater controller 150. The heater controller 150 compensates for heat transmitting from the wafer to the clamp section 116 and heats the clamp section 116 by controlling a heating value of the heating apparatus 148 based on temperature information from a temperature sensor (not shown) provided in the heating apparatus 148 such that the temperature distribution on the entire processing surface of the wafer W is uniformed. This structure allows both heat transmitted from the wafer W to the clamp section 116 and heat transmitted from the clamp section 116 to the wafer W to be substantially canceled out each other; therefore, even though the wafer W is clamped by the clamp section 116, the temperature distribution on the entire processing surface of the wafer W can uniformly be maintained without causing the heat of the wafer W from escaping through the clamp section 116 unlike in the prior arts, As a simple method, the clamp section 116 is always maintained at temperature which is higher than that of the mounting table 114 (for example, the clamp section 116 is always held at a temperature which is higher than that of the mounting table 114 by a fixed value or at a fixed temperature which is higher than that of the mounting table 114), without providing a temperature sensor in the heating apparatus 148 (but only in the heating apparatus 146); consequently, the temperature of the wafer can be uniformed.

In the present embodiment as described above, a zone heater constituted of a plurality of heaters, e.g., three heaters, is adopted as the heating apparatuses 146 and 148. Since, therefore, the temperature can be controlled independently for each of the heaters, the temperatures of the wafer W and the clamp section 16 can be controlled in part, and the temperature distribution on the entire processing surface of the wafer W can be maintained more uniformly. If, furthermore, the above zone heater is adopted, its heating efficiency can be improved more than when one heater is used for heating, and thus power consumption can be decreased. The number of heaters constituting the zone heater is not limited to the above, but it is needless to say that a zone heater constituted of a given number of heaters according to the structure of the apparatus can be adopted.

The wall portion of the processing chamber 102 and the gas supply section 118 are preheated to, e.g., 150° C. by their corresponding heaters 106 and 108. After the above conditions are met, processing gas constituted of a given flow rate of $TiCl_4$ and $NH_3$ is supplied onto the wafer W in the processing chamber 102, the processing chamber 102 is exhausted, and the processing chamber 102 is maintained in an atmosphere of predetermined pressure. Thus, a barrier metal layer constituted of TiN is formed on the wafer W.

As described above, in the present embodiment, inert gas passes the periphery of the wafer W when the wafer W is clamped by the clamp section 116, no processing gas reaches the periphery of the wafer W. As a result, no TiN-film layer is formed around the periphery of the wafer W, so that particles due to exfoliation of the TiN-film layer can be prevented from occurring. Since, moreover, the clamp section 116 is heated at a predetermined temperature, even though the wafer W is clamped by the clamp portion 116, the temperature distribution on the entire processing surface can be maintained uniformly and a TiN-film layer can be formed uniformly.

Figure 5:
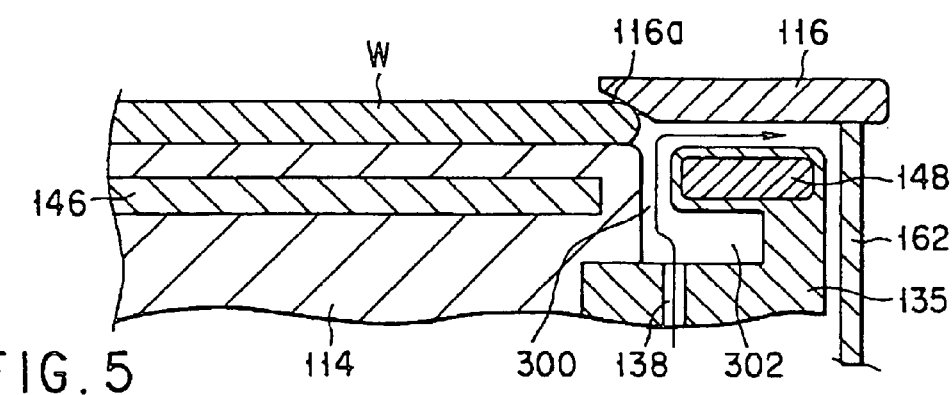
FIG. 5 is a cross-sectional view illustrating a modification to the structure of FIG. 4.
Figure 6A:
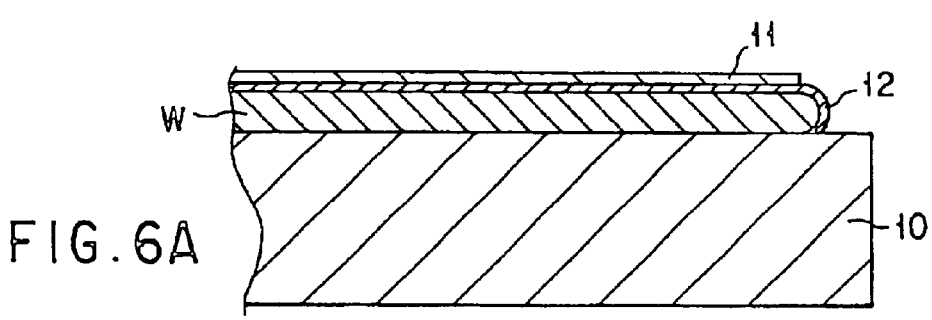
FIG. 6A is a cross-sectional view showing a wiring layer formed on a wafer with a TiN-film layer therebetween using a prior art thermal CVD system.
Figure 6B:
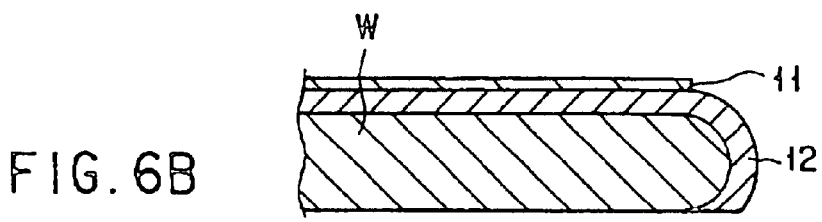
FIG. 6B is a cross-sectional view showing a state of a wafer W after CMP.

The preferred embodiment of the present invention has been described above with reference to the accompanying drawings; however, the present invention is not limited to the structure of the embodiment. One of ordinary skill in the art can think of various changes and modifications. It can be thought that the changes and modifications fall within the scope of techniques of the present invention. For example, in the above embodiment, the gas flow path is formed from almost the central part of the mounting table 114 toward its periphery; however, the present invention is not limited to this structure. For example, when a gas flow path 300 having an adequate length, as shown in FIG. 5, cannot be secured and therefore or predetermined conductance cannot be obtained due to the restriction by apparatus structure such as tubing, a conductance-adjustinq buffer section 302 having a given volume has to be provided in the gas flow path 300. In the foregoing embodiment, inert gas is adopted as film-deposition prevention gas; however, the present invention is not limited to such a structure. For example, the same gas as some of gas components constituting the processing gas, can be adopted as the film-depositing prevention gas. Since, in this case, the same gas as some of gas components constituting the processing gas is heated by a heating means for heating a clamp and emitted into the processing chamber, an influence thereof upon the film deposition can be minimized. Furthermore, a film, which is formed unexpectedly on the periphery of the wafer W, can be removed positively by causing cleaning gas such as $Cl_2$ gas and $ClF_3$ gas to flow in the backside-gas flow path. In the above embodiment, the structure for depositing a barrier metal layer formed of TiN is taken as an example and described; however, the present invention is not limited to this structure, but can be applied to the case where a high-melting-point metal-film layer, such as a Ti-film layer, a W layer, a Wsi layer and a Ta layer, is formed. In the foregoing embodiment, the processing apparatus having four CVD systems is taken as an example and described; however, the present invention is not limited to this structure but can be applied to a film deposition apparatus used alone or a processing apparatus having one or more film deposition apparatuses.

What is claimed is:

1. A film deposition apparatus comprising:
   a container forming a processing chamber for processing a target object;
   a mounting table which is provided in the processing chamber and on which the target object is mounted;
   a first heating apparatus provided in the mounting table;
   a first gas supply section provided in the container, for supplying processing gas into the processing chamber adapted to form a thin film on the target object mounted on the mounting table;

a movable clamp for clamping an edge portion of the target object and holding the target object on the mounting table;

a second heating apparatus formed separately from the mounting table to surround the mounting table and arranged below the clamp to be opposite the clamp;

a first gas flow path defined by the mounting table and the second heating apparatus;

a second gas flow path formed between the clamp and the second heating apparatus when the clamp is moved to a position where the clamp clamps the target object; and a second gas supply section for causing backside gas to flow into the first and second gas flow paths.

2. The film deposition apparatus according to claim 1, wherein the first and second gas flow paths extend so as to pass the edge portion of the target object clamped by the clamp.

3. The film deposition apparatus according to claim 1, wherein the backside gas acts as a heat-transfer medium for transferring heat from the second heating apparatus to the clamp.

4. The film deposition apparatus according to claim 1, wherein the backside gas acts as film-depositing prevention gas for preventing the processing gas from diffusing around the edge portion of the target object.

5. The film deposition apparatus according to claim 1, wherein the second gas supply section is configured to supply cleaning gas for removing a film from the edge portion of the target object.

6. The film deposition apparatus according to claim 1, wherein the backside gas is constituted of inert gas.

7. The film deposition apparatus according to claim 1, wherein the backside gas is constituted of same gas as part of gas components constituting the processing gas.

8. The film deposition apparatus according to claim 1, wherein the first gas supply section is configured to supply processing gas to form a high-melting-point metal film layer.

9. The film deposition apparatus according to claim 1, wherein the gas flow path is provided with a buffer section for controlling conductance of the gas flow path.

10. The film deposition apparatus according to claim 1, further comprising a control section for controlling a heating value of the second heating apparatus such that temperature distribution on an entire processing surface of the target object is uniformed.

11. The film deposition apparatus according to claim 1, wherein the clamp is shaped like a ring and clamps all of the edge portion of the target object against an inner edge portion thereof.

12. The film deposition apparatus according to claim 11, wherein the inner edge portion of the clamp, against which the target object is clamped, has a tapered surface which is brought into line contact with the target object.

13. The film deposition apparatus according to claim 2, wherein the backside gas acts as a heat-transfer medium for transferring heat from the second heating apparatus to the clamp.

14. The film deposition apparatus according to claim 2, wherein the backside gas acts as film-depositing prevention gas for preventing the processing gas from diffusing around the edge portion of the target object.

15. The film deposition according to claim 2, wherein the second gas supply section is configured to supply cleaning gas for removing a film from the edge portion of the target object.

16. A film deposition apparatus comprising:

a container forming a processing chamber for processing a target object;

a mounting table which is provided in the processing chamber and on which the target object is mounted, a first heating apparatus provided in the mounting table, a first gas supply section provided in the container, for supplying processing gas into the processing chamber adapted to form a thin film on the target object mounted on the mounting table;

a movable clamp for clamping an edge portion of the target object by an inner peripheral tapered surface of the clamp and holding the target object on the mounting table;

a second heating apparatus arranged below the clamp to be opposite to the clamp;

a gas flow path defined by the clamp, the second heating apparatus, and the mounting table when the clamp is moved to a position where the clamp clamps the target object; and a second gas supply section for causing backside gas to flow into the gas flow path to direct the gas to an outer periphery of the clamp.

17. The film deposition apparatus according to claim 16, wherein the gas flow path extends so as to pass the edge portion of the target object clamped by the clamp.

18. The film deposition apparatus according to claim 17, wherein the backside gas acts as a heat-transfer medium for transferring heat from the second heating apparatus to the clamp.

19. The film deposition apparatus according to claim 17, wherein the backside gas acts as film-depositing prevention gas for preventing the processing gas from diffusing around the edge portion of the target object.

20. A film deposition apparatus comprising:

a container forming a processing chamber for processing a target object;

a mounting table which is provided in the processing chamber and on which the target object is mounted, a first heating apparatus provided in the mounting table, a first gas supply section provided in the container, for supplying processing gas into the processing chamber adapted to form a thin film on the target object mounted on the mounting table;

a movable clamp for clamping an edge portion of the target object and holding the target object on the mounting table;

a second heating apparatus arranged below the clamp to be opposite to the clamp;

a gas flow path defined by the clamp, the second heating apparatus, and the mounting table when the clamp is moved to a position where the clamp clamps the target object; and a second gas supply section for causing backside gas to flow into the gas flow path.

* * * * *